US011500356B2

(12) United States Patent
Tong et al.

(10) Patent No.: US 11,500,356 B2
(45) Date of Patent: Nov. 15, 2022

(54) BEZEL MEMBER, CONTROL METHOD THEREOF AND BEZEL DEVICE

(71) Applicant: BOE Technology Group Co., Ltd., Beijing (CN)

(72) Inventors: Lu Tong, Beijing (CN); Enhui Guan, Beijing (CN); Xiangxiang Zou, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 633 days.

(21) Appl. No.: 16/536,541

(22) Filed: Aug. 9, 2019

(65) Prior Publication Data
US 2020/0050177 A1      Feb. 13, 2020

(30) Foreign Application Priority Data

Aug. 10, 2018   (CN) .......................... 201810909160.6

(51) Int. Cl.
 *G05B 19/416* (2006.01)
 *H05K 5/00* (2006.01)
 *H05K 5/02* (2006.01)

(52) U.S. Cl.
 CPC ......... *G05B 19/416* (2013.01); *H05K 5/0017* (2013.01); *H05K 5/0243* (2013.01); *G05B 2219/49147* (2013.01)

(58) Field of Classification Search
 CPC ........ G05B 19/416; G05B 2219/49147; H05K 5/0017; H05K 5/0243; G02F 1/13332; G02F 1/133328; G02F 2203/11; G02F 1/133308
 See application file for complete search history.

(56) References Cited

U.S. PATENT DOCUMENTS

| | | | | |
|---|---|---|---|---|
| 2006/0164230 | A1* | 7/2006 | DeWind | B60K 37/06 340/461 |
| 2014/0192077 | A1* | 7/2014 | Gomi | G09G 5/02 345/589 |
| 2019/0394455 | A1* | 12/2019 | Hogo | G06F 1/1601 |

FOREIGN PATENT DOCUMENTS

| | | |
|---|---|---|
| CN | 105643493 A | 6/2016 |
| CN | 106425920 A | 2/2017 |
| CN | 206991328 U | 2/2018 |
| CN | 107803765 A | 3/2018 |

OTHER PUBLICATIONS

First Office Action and English language translation, CN Application No. 201810909160.6, dated Dec. 20, 2019, 11 pp.

\* cited by examiner

*Primary Examiner* — Chad G Erdman
(74) *Attorney, Agent, or Firm* — Myers Bigel, P.A.

(57) ABSTRACT

A bezel member, a control method thereof, and a bezel device are disclosed. The bezel member includes a bezel mechanism including a fixed part and a retractable part connected to the fixed part, a detecting mechanism configured to perform neighboring object presence detection for an end portion of the retractable part and generate a detection signal based on a detection result of the neighboring object presence detection, and a control mechanism configured to control the extension and retraction of the retractable part according to the detection signal.

16 Claims, 4 Drawing Sheets

BEZEL MEMBER, CONTROL METHOD THEREOF AND BEZEL DEVICE

RELATED APPLICATIONS

The present application claims the benefit of Chinese Patent Application No. 201810909160.6, filed on Aug. 10, 2018, the entire disclosure of which is incorporated herein by reference.

TECHNICAL FIELD

The present disclosure relates to the field of display technologies, and in particular, to a bezel member, a control method thereof, and a bezel device.

BACKGROUND

A bezel is a frame that is fixed around an object to protect and decorate the object. For example, a bezel of a display device is fixed around a display screen, that is, the display screen is encapsulated, thereby protecting and decorating the display screen; a bezel of calligraphy and painting works is encapsulated around the calligraphy or painting art works, thereby protecting and decorating them.

The bezel of the related art is usually of a fixed structure, that is, the size of the bezel is fixed. Therefore, a bezel having a fixed size can only be used for an object of a specific size, and cannot be applied to objects of different sizes other than the specific size, and the scope of application is relatively small.

SUMMARY

According to one aspect of the present disclosure, there is provided a bezel member comprising a bezel mechanism comprising a fixed part and a retractable part connected to the fixed part; a detecting mechanism configured to perform neighboring object presence detection for an end portion of the retractable part and generate a detection signal based on a detection result of the neighboring object presence detection; and a control mechanism configured to control the extension and retraction of the retractable part according to the detection signal.

In the bezel member according to some embodiments of the present disclosure, the detecting mechanism comprises a first detector disposed at a side of the end portion of the retractable part of the bezel mechanism and configured to: perform the neighboring object presence detection for the side of the end portion, and generate a first signal in response to detecting the presence of an neighboring object for the side of the end portion, otherwise generate a second signal, and wherein the control mechanism is further configured to control the retractable part to extend in response to the first signal and control the retractable part to stop extending in response to the second signal.

In the bezel member according to some embodiments of the present disclosure, the control mechanism further comprises a second detector disposed at an end face of the end portion of the retractable part of the bezel mechanism configured to perform the neighboring object presence detection for the end face of the end portion and generate a third signal in response to detecting the presence of an neighboring object for the end face of the end portion, and wherein the control mechanism is further configured to control the retractable part to stop extending in response to at least one of the second signal or the third signal.

In the bezel member according to some embodiments of the present disclosure, the second detector is further configured to detect whether there is the first detector in an extending direction of the retractable part, and in response to the presence of the first detector in the extending direction, to detect a distance between the first detector and the second detector, and wherein the control mechanism is further configured to control extension and retraction of the retractable part according to the distance.

In the bezel member according to some embodiments of the present disclosure, at least one of the first detector and the second detector comprises at least one of a distance detector and a presence detector. In some embodiments, the distance sensor comprises an optical distance sensor, an infrared distance sensor, an ultrasonic distance sensor, and the presence detector comprises an infrared or other heat based presence detectors, and ultrasound or other sound based presence detectors.

In the bezel member according to some embodiments of the present disclosure, the first detector is disposed at a first distance from the end face on the side of the end portion of the retractable part, the first distance being equal to the width of the bezel mechanism.

In the bezel member according to some embodiments of the present disclosure, the bezel mechanism comprises a drive mechanism configured to drive the extension and retraction of the retractable part, and wherein the control mechanism is further configured to control the drive mechanism according to the detection signal, to control the extension and retraction of the retractable part.

In the bezel member according to some embodiments of the present disclosure, the retractable part is sleeved outside or inside the fixed part and the fixed part and the retractable part are connected to each other by a sliding mechanism.

In the bezel member according to some embodiments of the present disclosure, the sliding mechanism comprises a slide rail and a pulley movable along the slide rail, wherein the slide rail is fixed to the fixed part and the pulley is fixed to the retractable part.

In the bezel member according to some embodiments of the present disclosure, the sliding mechanism comprises at least one of a ball bearing slider and a slider equipped with a roller.

In the bezel member according to some embodiments of the present disclosure, the retractable part comprises a plurality of retractable sub-portions that are connected by nesting.

In the bezel member according to some embodiments of the present disclosure, the control mechanism is further configured to receive a control signal and control the extension and retraction of the retractable part according to the control signal.

According to another aspect of the present disclosure, there is provided a bezel device comprising a plurality of bezel units configured to cooperate with each other, wherein each of the bezel units comprises one or more bezel members as described in some embodiments of the present disclosure.

In the bezel device according to some embodiments of the present disclosure, at least one of the plurality of bezel units comprises two bezel members, wherein the two bezel members are rotatably connected relative to each other at the end portions of the respective fixed parts such that a variable angle is formed between the two bezel members.

According to a further aspect of the present disclosure, there is provided a method for controlling a bezel member according to some embodiments of the present disclosure, the method comprising: performing neighboring object presence detection for the end portion of the retractable part of the bezel mechanism and generating a detection signal based on a detection result of the neighboring object presence detection by using the detecting mechanism; and controlling the extension and retraction of the retractable part according to the detection signal by using the control mechanism.

In the method for controlling a bezel member according to some embodiments of the present disclosure, the step of performing neighboring object presence detection for the end portion of the retractable part of the bezel mechanism and generating a detection signal based on a detection result of the neighboring object presence detection by using the detecting mechanism, comprises: performing neighboring object presence detection for a side of the end portion, and, in response to detecting the presence of a neighboring object for the side of the end portion, generating a first signal, otherwise generating a second signal; and performing neighboring object presence detection for an end face of the end portion, and, in response to detecting the presence of a neighboring object for the end face of the end portion, generating a third signal, and wherein the step of controlling the extension and retraction of the retractable part according to the detection signal comprises: in response to the first signal, controlling the retractable part to extend, and in response to at least one of the second signal and the third signal, controlling the retractable part to stop extending.

DETAILED DESCRIPTION OF EMBODIMENTS

To make the above objects, features and advantages of the disclosure more apparent, the present disclosure will be further described in detail below in conjunction with accompanying drawings and specific embodiments.

In the description of the present disclosure, unless otherwise stated, the meaning of "a plurality" is two or more; the terms indicating the orientation or positional relationships, such as "upper", "lower", "left", "right", "inside", "outside" are based on the orientation or positional relationships shown in the drawings, and are merely for the convenience of describing the present disclosure and the simplified description, and do not indicate or imply that the machines or components referred to must have a specific orientation, or be constructed and operated in a specific orientation. Therefore they are not to be construed as limiting the disclosure.

In the description of the present disclosure, unless otherwise explicitly specified and defined, it should be noted that, the terms "install", "couple", and "connect" are to be understood broadly, and may for example be fixedly connected or detachably connected, integrally connected; mechanically or electrically connected; directly connected or indirectly connected through an intermediate medium. The specific meanings of the above terms in the present disclosure can be understood in the specific circumstances by those skilled in the art.

The specific embodiments of the present disclosure are further described in detail below with reference to the accompanying drawings and embodiments. The following embodiments are intended to illustrate the disclosure, but are not intended to limit the scope of the disclosure.

Figure 1:
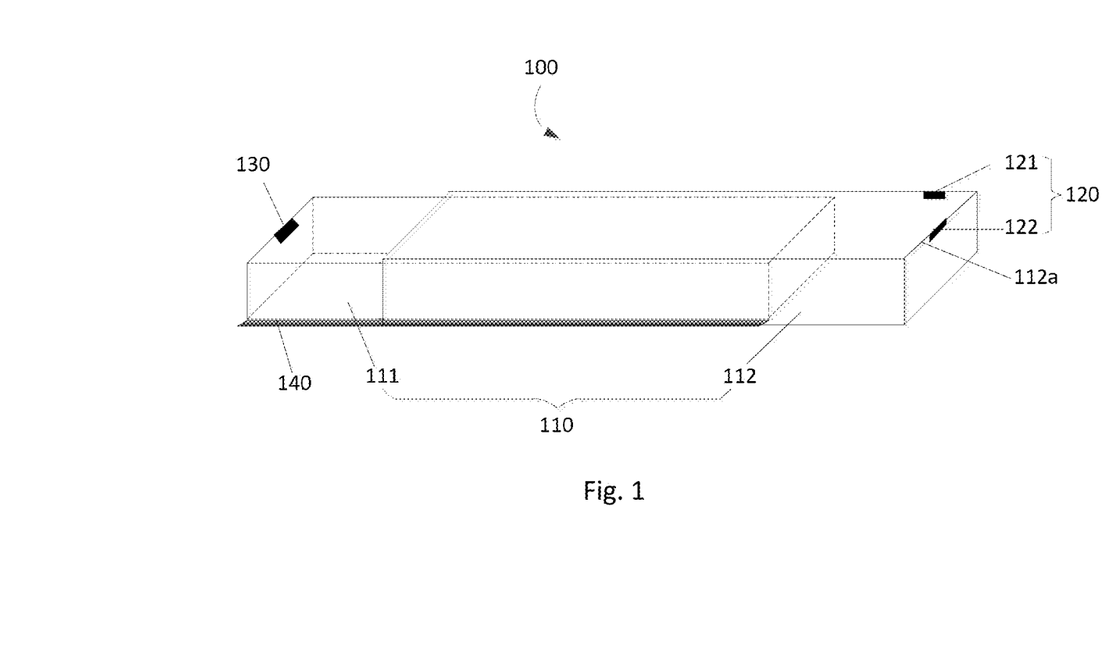
FIG. 1 illustrates a structural schematic view of a bezel member in accordance with some embodiments of the present disclosure.
Figure 2:
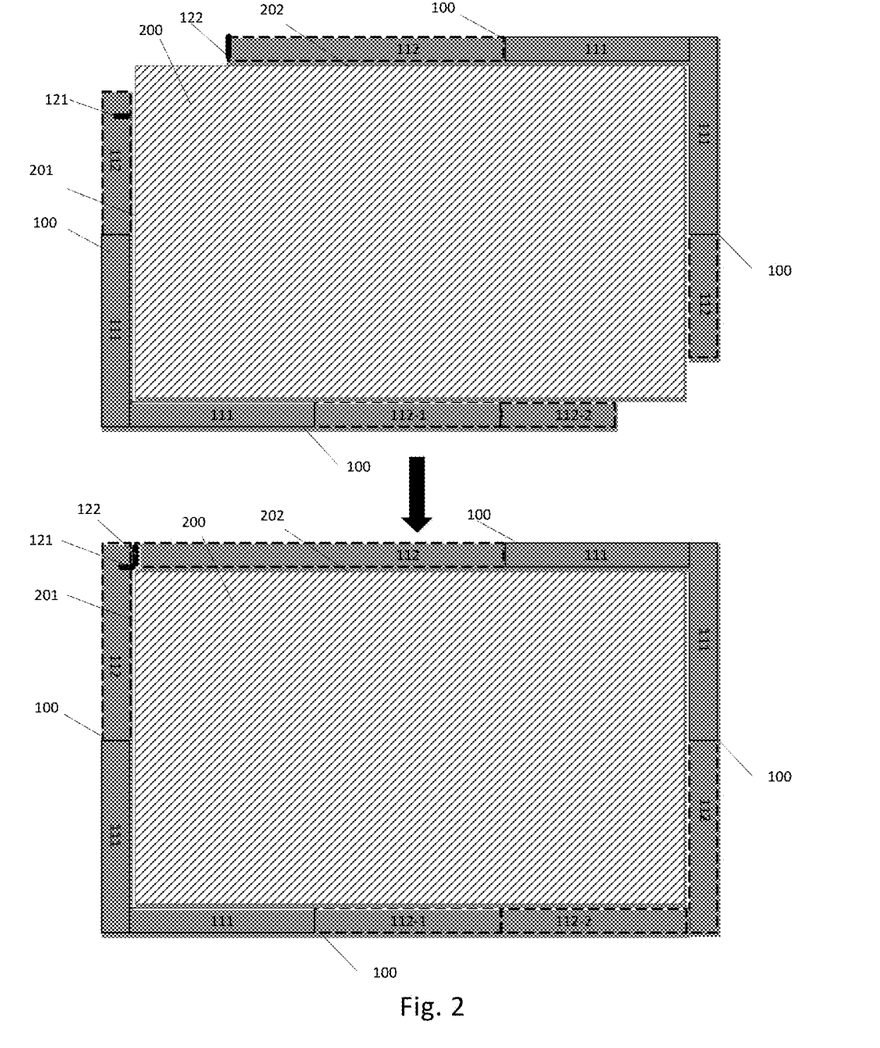
FIG. 2 illustrates a working principle diagram of a bezel member in accordance with some embodiments of the present disclosure.

FIG. 1 and FIG. 2 schematically illustrate a structural diagram and a working principle diagram of a bezel member in accordance with some embodiments of the present disclosure, respectively.

As shown in FIG. 1, a bezel member 100 comprises a bezel mechanism 110 comprising a fixed part 111 and a retractable part 112 connected to the fixed part 111; a detecting mechanism 120 configured to perform neighboring object presence detection for an end portion 112a of the retractable part 112 and generate a detection signal based on a detection result of the neighboring object presence detection; and a control mechanism 130 configured to control the extension and retraction of the retractable part 112 according to the detection signal.

In the present disclosure, a bezel refers to a frame that is fixed around an object or target, or enclosed or encapsulated along its edge, to protect and decorate it, where the object or target enclosed or encapsulated may comprise display-type devices (such as electronic picture frame, mobile phone displays), artworks (such as paintings), photos, or any other target that can be encapsulated. Hereinafter, for the sake of easy understanding, "target" is used to mean an object in which a bezel member or a bezel device is used for fixing or encapsulating.

As shown in FIG. 2, the bezel member 100 can be considered to be part of a full bezel or bezel device, and a plurality of (four in the FIG. 2) bezel members 100 can be combined to form one integral bezel device for encapsulating or fixing the target 200. In the bezel member 100, since the retractable part 112 can be extended, retracted or moved with respect to the fixed part 111, the size of the bezel member 100 can be adjusted, so that it can be applied to various different sizes of the targets 200.

On the other hand, as shown in FIG. 2, in the process of adjusting the extension and retraction of the bezel member 100 to accommodate targets of different sizes, the bezel member 100 may be brought close to one edge 201 of the target 200, and the end portion of the fixed part 111 of the bezel member 100 is enabled to align with the apex of the edge 201 of the target. Then the positional relationship between the retractable part 112 of the bezel mechanism 110 and the target 200 is detected by the detecting mechanism 120, so that the size relationship between the current length of the bezel mechanism 110 and the length of the corresponding edge 201 of the target 200 is known. Therefore, based on the size relationship, the extension and retraction of the retractable part 112 of the bezel mechanism 110 is adjusted in real time to ultimately adapt the size of the bezel member 110 to the target 200. In this process, the detection mechanism 120 can perform the neighboring object presence detection in real time for the end portion 112a of the retractable part 112 to obtain the size relationship between the bezel mechanism 110 and the corresponding edge 201 of the target 200 and generate a corresponding detection signal.

The control mechanism 130 can automatically control the extension and retraction of the retractable part 112 based on the detection signal generated by the detecting mechanism 120. The control mechanism 130 may comprise separate hardware, software, firmware, or a combination thereof capable of implementing its respective control functions, such as a processor, a SCM (Single Chip Microcomputer), or a chip having a data transceiving and processing capability, and a discrete logic circuit of logic gate circuit having logic functions for data signals, an application specific integrated circuit with suitable combination logic gate circuit, Programmable Gate Array, Field Programmable Gate Array, and the like, or a combination of any two or more of the above hardwares.

In the bezel member 100 according to some embodiments of the present disclosure, adaptive adjustment for various different sizes of encapsulated targets is achieved due to the introduction of the detection mechanism 120 and the control mechanism 130, i.e. the bezel member 100 can automatically adjust the length of its bezel mechanism 110 according to the size of the outer contour of the target to adapt to the sizes of different targets without manual adjustments.

In a bezel member according to some embodiments of the present disclosure, although not shown in the drawings, the bezel mechanism 100 may further comprise a drive mechanism configured to drive the extension and retraction of the retractable part 112, and the control mechanism 130 is configured to control the drive mechanism according to the detection signal, to control the extension and retraction of the bezel mechanism 110. The drive mechanism can drive the extension and retraction of the retractable part 112 by, for example, electric, hydraulic, pneumatic, electromagnetic, or the like. Depending on the driving mode, the drive mechanism can therefore be a drive circuit or other type of drive device, such as a micromotor or the like.

In the present disclosure, the term "neighboring object presence detection" for an end portion 112a of the retractable part 112 means detecting whether there is an neighboring object (such as an target 200 that are encapsulated or fixed or other objects) in the vicinity of the end portion 112a, where "neighboring" herein refers to proximity, adjacency, and may comprise, but is not limited to, contact to each other or non-contact proximity to each other with a small distance. Herein, the end portion 112a of the retractable part 112 refers to the end of the retractable part 112, which may comprise an end face of the end and a small portion of the side adjacent to the end face. Hereinafter, "end face" of the end portion 112a of the retractable part 112 refers to the surface of the end of the retractable part 112, and "side" of the end portion 112a refers to a small portion of the side of the retractable part 112 adjacent to the end face of the end portion 112a.

In some embodiments, as shown in FIG. 1, the detection mechanism 120 can comprise a first detector 121 disposed at a side of the end portion 112a of the retractable part 112 that is configured to perform neighboring object presence detection for the side of the end portion, and generate a first signal in response to detecting the presence of an neighboring object for the side of the end portion, otherwise a second signal is generated, where the control mechanism 130 is further configured to control the retractable part 112 to extend in response to the first signal, and control the retractable part 112 to stop extending in response to the second signal. More specifically, as shown in FIG. 1 and FIG. 2, the first detector 121 may be disposed, for example, at a brim of the intersection of the side and the end face of the end portion 112a of the retractable part 112 to detect whether the end portion 112a neighbors the edge 201 of the target 200, and to generate a detection signal (comprising the first signal and the second signal) according to the detection result. Based on the detection signal, the control mechanism 130 can control the extension and retraction of the bezel mechanism 110. For example, during control of the extension of the retractable part 112 (i.e., the initial size of the bezel member 100 is less than the size of the corresponding edge of the target 200), when the detection mechanism 120 detects that there is a neighboring object (i.e. target 200) at its end portion 112a, particularly its side of the end portion, the first signal is generated, indicating that the end portion 112a of the retractable part 112 of the bezel mechanism 110 is blocked by the edge 201, that is, the extension or elongation of the retractable part 112 is not yet in place, and the retractable part 112 need to continue to extend. If the neighboring object (i.e. target 200) is not detected, a second signal is generated, indicating that the length of the bezel mechanism 110 exceeds the length of the edge 201. At this time, it indicates that the current length of the bezel member 100 has been adapted to the size of the target, the extension adjustment is finished and the extension can be stopped. The control mechanism 130 can be configured to receive the detection signal, i.e., the first signal and the second signal, from the first detector 121, and to control the retractable part 112 to extend or stop extending described above based on the response signal.

In some embodiments, the first detector 121 can be disposed at a first distance from the end face on the side of the end portion of the retractable part 112, where the first distance can be equal to the width of the bezel mechanism 110 or the bezel member 100. In this way, when the first detector 121 does not detect the presence of a neighboring object (i.e., when it does not neighbor the target 200), the side of the end portion can exactly exceed the corresponding edge 201 of the target by the first distance (i.e., the width of the bezel mechanism 110). At this time, the control mechanism 130 controls the retractable part 112 to stop extending, which facilitates the perfect matching and fitting of the bezel by cooperatively using the plurality of identical bezel members 100. As shown in FIG. 2, the length of the retractable part 112 of the left side bezel member 100 beyond the corresponding edge of the target is equal to the width of the upper side bezel member, thus achieving a perfect fitting of the neighboring bezel members 100.

In some embodiments, for the purpose of alignment, when the neighboring object (i.e., the target) is detected, the retractable part 112 may also be appropriately retracted such that the end face 112a thereof is flush with the upper side of the target 200, thereby causing the bezel mechanism to exactly match the size of the corresponding edge 201 of the target. For example, in the case where the first detector 121 is disposed at a first distance from the end face on the side of the end portion of the retractable part 112, if the user desires to achieve sufficient matching between the bezel member 100 and the corresponding edge 201, i.e., the both has the completely same length (instead of exceeding), the control mechanism 130 may further control the retractable part 112 to retract by the first distance after stopping the extension based on the second signal generated when the first detector 121 detects that there is no object on the side of the retractable part 112, in order to achieve sufficient matching between the length of the bezel mechanism 110 and the edge 201.

In some embodiments, as shown in FIG. 1, the detection mechanism 120 can further comprise a second detector 122 disposed at an end face of the end portion 112a of the retractable part 112 of the bezel mechanism 110. The second detector 122 is configured to perform the neighboring object presence detection for the end face, and generate a third signal in response to detecting the presence of an neighboring object for the end face, and where the control mechanism 130 is further configured to control the retractable part 112 to stop extending in response to at least one of the second signal and the third signal. The second detector 122 is mainly used to detect whether there is an obstacle in the extension and retraction direction of the retractable part 112 during its extension and retraction process. And if there is an obstacle, a third signal is sent, based on which the control mechanism 130 stops extending, to avoid the damage caused by collision with the obstacle. As shown in FIG. 2, for the bezel member 100 for the upper edge 202 of the target 200, the obstacle here may be another bezel member 100 on the left side edge 201. As shown in FIG. 2, when two bezel members corresponding to adjacent edges adjacent to the same target are used cooperatively, in case that the bezel member 100 corresponding to the left side edge 201 may have completed the extension and retraction adjustment and exceeded the length of the corresponding edge 202, the bezel member 100 of the upper edge 202 may collide or interfere with the excess portion of the upper side bezel member 100 if the bezel member 100 of the upper edge 202 still stops extending or retracting according to the second signal of the first detector 121. Therefore, in order to avoid the extension and retraction interference and collision between the adjacent bezel members 100, the second detector 122 is required to perform neighboring object presence detection in the extension and retraction direction of the retractable part 112 of the bezel member 100 and generate a third signal based on the detection result. Thus, under the combined action of the first and second detectors 121, 122, three detection signals can be obtained, namely the first, second, and third signals, which respectively correspond to whether the side of the end portion is adjacent to the object or target, and whether there is a neighboring object at the end face of the end portion (i.e., in the extension and retraction direction). And the control mechanism 130 can control the retractable part 112 to start and continuously extend and retract based on the first signal, and stop the extension and retraction process based on at least one of the second signal or the third signal, thereby avoiding interferences with other adjacent bezel mechanisms while ensuring that the extension and retraction is in place.

In some embodiments, the first and second detectors 121, 122 may be presence detectors for detecting whether there is a neighboring object, which may comprise, for example, infrared or other heat based detectors, and ultrasound or other sound based detectors. In addition, the presence detector for detecting whether there is a neighboring object actually detects whether there is an object within a certain distance (a relatively small distance), and thus a distance sensor can also be used to perform neighboring object presence detection. Optionally, at least one of the first detector and the second detector may also comprise a distance detector having an adjacent object detection function, such as an optical distance sensor, an infrared distance sensor, an ultrasonic distance sensor, and the like.

In some embodiments, as shown in FIG. 1, the retractable part 112 of the bezel mechanism 110 of the bezel member 100 may be sleeved outside the fixed part 111 and the fixed part 111 and the retractable part 112 are connected by a sliding mechanism 140. Although not shown in the drawings, the retractable part may of course be sleeved inside the fixed part 111. In the sliding mechanism 140, a slide rail and a pulley movable along the slide rail may be comprised, where the slide rail is fixed to the fixed part and the pulley is fixed to the retractable part. In this way, the retractable part 112 and the fixed part 111 can be relatively moved by the mutual cooperation of the slide rail and the pulley, that is, the extension and retraction of the retractable part 112. As described above, the movement, extension and retraction of the retractable part 112 relative to the fixed part 111 can be achieved by a drive mechanism (although not shown). Optionally, the driving mechanism may comprise a micromotor and a driving rod. The driving rod is respectively connected to the micromotor and the pulley, and the micromotor is electrically connected to the control mechanism. The micromotor drives the pulley to slide in the slide rail by driving the driving rod according to the control instruction of the control mechanism 130, to realize the movement of the retractable part 112 relative to the fixed part 111 to realize the extension and retraction of the bezel member 100.

In some embodiments, the sliding mechanism may not be limited to the rail-pulley mode illustrated in FIG. 1, but may also comprise other forms that enable relative movement or extension and retraction of the retractable part and the fixing portion. For example, the sliding mechanism can be a ball bearing slider or a slider equipped with a roller, or the like. In some embodiments according to the present disclosure, the sliding mechanism 140 may comprise first and second sliders disposed in parallel with each other between the fixed part 111 and the left and right side edges of the retractable part 112. Such a double slider arrangement can ensure steady and smooth sliding during the relative sliding between the fixed part 111 and the retractable part 112.

In some embodiments, as shown in FIG. 2, to achieve a greater range of extension, the retractable part 112 can comprise one or more retractable sub-portions 112-1, 112-2. Regarding the number of the retractable sub-portions, it can be set according to actual conditions. Generally, the more the number, the larger the retractable or adjustable range of the retractable part 112, so that more targets 200 of different sizes can be accommodated. Further, each of the retractable sub-portions 112-1, 112-2 is connected by any means that can achieve relative extension and retraction. For example, similar to the manner in which the retractable part 112 and the fixed part 111 shown in FIG. 1 are connected, the retractable sub-portions 112-1, 112-2 can be connected by nesting and can achieve relative movement by a sliding mechanism. Specifically, the plurality of retractable sub-portions 112-1, 112-2 may be nested in sequence. Except for the retractable sub-portion nested in the outermost layer, slide rails are disposed on both sides of the bottom surface of other retractable sub-portions, and each of the retractable sub-sections is provided with a pulley. The pulley of the retractable sub-section that is nested outside is disposed on the track of the retractable sub-section that is nested inside. The movement of the retractable sub-section that is nested outside relative to the retractable sub-section that is nested inside is achieved by sliding of the pulley in the track.

In the bezel member according to the present disclosure, the control mechanism may be further configured to receive a control command or a control signal input by the user and control the extension and retraction of the retractable part according to the control signal, in addition to being configured to perform extension and retraction control of the retractable part according to the detection signal generated by the detecting mechanism, thereby achieving personalized bezel extension and retraction control and enriching the user experience. In addition to adaptively controlling the extension and retraction according to the size of the target, the bezel member according to the present disclosure can adjust its extension and retraction according to the size adjustment command of the user. In order to implement the above-described personalized adjustment function, the control mechanism may comprise a signal receiving module configured to receive a control command or a control signal sent by a user through an input device (such as a Bluetooth or an infrared remote controller or the like), and perform the corresponding extension and retraction adjustment action according to the received control signal. The control signal may comprise turning on the extension and retraction function, starting the extension, stopping the extension, starting the retraction, stopping the retraction, extension and retraction swapping, and the like. In particular, the control mechanism may be configured to return the retractable part from the extended state to the original state according to the control command, that is, the retractable part is returned from a state of staggering with the fixed part to a state of being stacked with the fixed part, thereby achieving flexible application of the bezel member. The communication mode between the user and the control mechanism can be implemented by any wired or wireless means, especially wireless means, such as short-range wireless communication modes e.g., Bluetooth, infrared, and Wifi.

Figure 3:
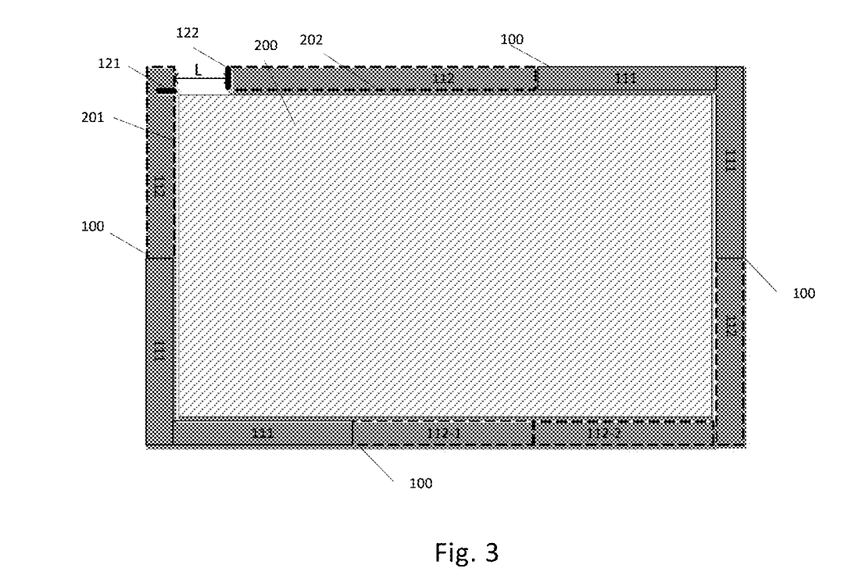
FIG. 3 illustrates a working principle diagram of a bezel member in accordance with further embodiments of the present disclosure.

FIG. 3 illustrates a working principle diagram of a bezel member in accordance with further embodiments of the present disclosure. In the bezel member according to some embodiments of the present disclosure, the second detector 122 disposed at the end face of the retractable part 112 may be further configured to detect in advance whether there is a first detector 121 in an extending direction of the retractable part 112 (at a certain distance) before the collision may occur and to detect the distance between the two in the presence of the first detector 121, in addition to detecting the neighboring presence detection. As shown in FIG. 3, during the leftward extension of the upper bezel member 100, the left side bezel member 100 may have been extended into position and beyond the upper brim by a certain distance, at which time the second detector of the upper bezel member can sense in real time whether there is a first detector 121 disposed on the side of the left side bezel member in the forward direction thereof, thereby determining whether there is an obstacle in the forward direction. As shown in FIG. 3, the second detector 122 of the upper bezel member 100 can detect the first detector of the left side bezel member 100, thereby detecting the distance L between the two, and if L=0, the extension and retraction can be stopped. If the distance L is not equal to zero, the extension can be continued until L=0. Thus, by detecting the presence of the obstacle in the forward direction and the distance from the obstacle in real time, it is also possible to control the extension process of the bezel member to avoid the occurrence of collision or interference.

Figure 4:
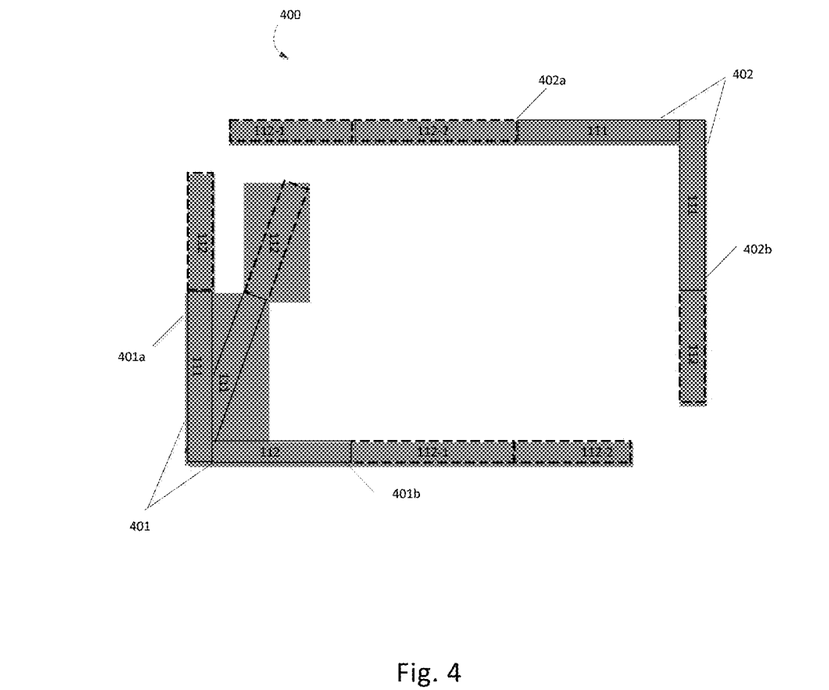
FIG. 4 shows a schematic structural view of a bezel device in accordance with some embodiments of the present disclosure.

FIG. 4 schematically illustrates a structural diagram of a bezel device in accordance with some embodiments of the present disclosure. The bezel device 400 illustrated in FIG. 4 can be constructed from a plurality of bezel members in accordance with some embodiments of the present disclosure. In other words, the bezel device 400 can be obtained by combining the bezel members shown in FIG. 1 and FIG. 2 in a certain way. Specifically, as shown in FIG. 4, the bezel device 400 may comprise a plurality of bezel units 401, 402 configured to cooperate with each other to form an enclosed shape encapsulating the target, where each of the bezel units 401, 402 respectively comprises one or more bezel members 401a-b and 402a-b according to some embodiments of the present disclosure.

As shown in FIG. 4, the bezel device 400 comprises a first bezel unit 401 and a second bezel unit 402, where the first bezel unit 401 comprises a first bezel member 401a and a second bezel member 401b, and the second bezel unit 402 comprises a third bezel member 402a and fourth bezel member 402b. The bezel members 401a, 401b are rotatably connected relative to each other at the end portions of the respective fixed parts 112 such that a variable angle is formed between the two. As shown in FIG. 4, in the first bezel unit 401, the first and second bezel members 401a, 401b can be rotatably connected to achieve the adjustability of the angle between the two, thereby being able to adapt to different targets with different contours. Similarly, in the second bezel unit 402, the third and fourth bezel members 402a and 402b can also achieve a variable angle in the same manner. The bezel units with such variable angles are more generally adaptable to different contours. For example, for a polygonal target, the angle between neighboring edges is not fixed. For example, the inner angle of the regular triangle is 60 degrees, and the maximum angle of the right triangle is 90 degrees. Optionally, as shown, the first and second bezel mechanisms 401a, 401b may also be connected to each other at the end portions of the fixed part by a fixed connection to form an "L" shaped bezel unit, which is applicable to the encapsulation and fixation of the target with a general square or rectangular shape.

Further, although only the case where each of the bezel units 401, 402 comprises two bezel members is illustrated in FIG. 4, it should be understood that each bezel unit may also comprise other numbers of bezel members, for example, each bezel unit comprises only one bezel mechanism or three or more bezel mechanisms.

Figure 5:
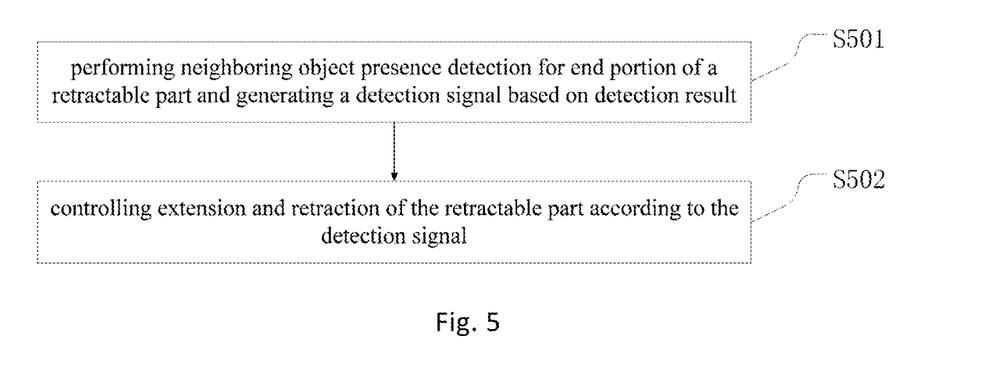
FIG. 5 illustrates a flow chart of a method for controlling a bezel member in accordance with some embodiments of the present disclosure.

FIG. 5 illustrates a flow chart of a control method for a bezel member in accordance with some embodiments of the present disclosure. The bezel member control method illustrated in FIG. 5 according to some embodiments of the present disclosure may be used to control a bezel member in accordance with some embodiments of the present disclosure. Referring to FIG. 5, a bezel member control method according to some embodiments of the present disclosure comprises the following steps:

S501, performing neighboring object presence detection for the end portion of the retractable part of the bezel member and generating a detection signal based on a detection result by using the detecting mechanism;

S502, controlling the extension and retraction of the retractable part according to the detection signal by using the control mechanism.

With regard to a detailed explanation of the bezel member control method illustrated in FIG. 5, please refer to FIGS. 1-3 and the above description regarding the bezel member according to some embodiments of the present disclosure.

Figure 6:
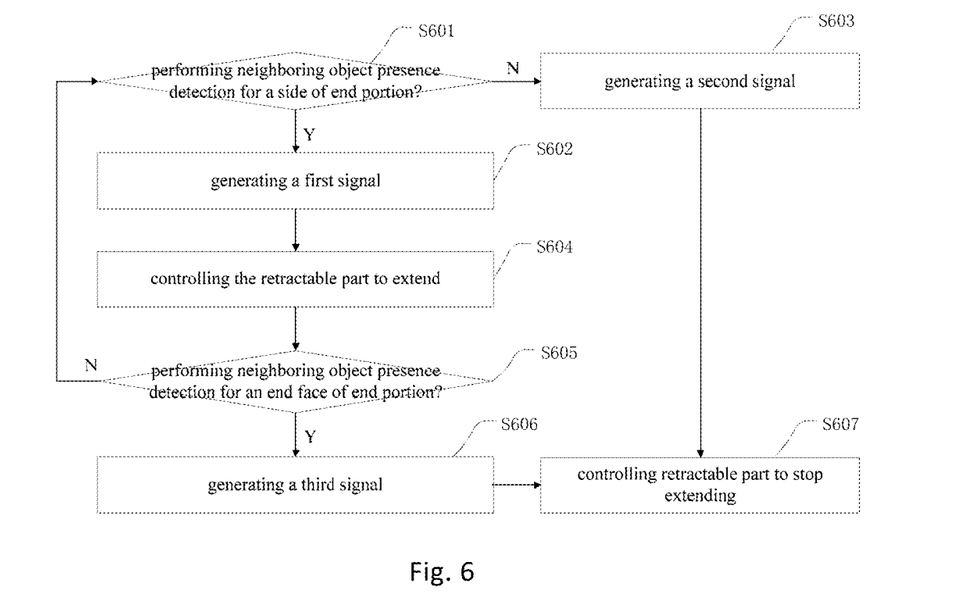
FIG. 6 illustrates a flow chart of a method for controlling a bezel member in accordance with further embodiments of the present disclosure.

FIG. 6 illustrates a flow chart of a control method for a bezel member in accordance with further embodiments of the present disclosure. As shown in FIG. 6, the control method comprises:

S601, performing neighboring object presence detection for a side of the end portion;

S602, in response to the presence of a neighboring object for the side of the end portion, generating a first signal, and then going to S604;

S603, in response to the absence of a neighboring object for the side of the end portion, generating a second signal, and then going to S607;

S604, in response to the first signal, controlling the retractable part to extend;

S605, performing neighboring object presence detection for an end face of the end portion;

S606, in response to the presence of a neighboring object for the end face of the end portion, generating a third signal and then going to S607, otherwise going to step S601;

S607, in response to the second signal or the third signal, controlling the retractable part to stop extending.

In the description of the present specification, the descriptions of the terms "one embodiment", "some embodiments", "example", "specific examples", or "some examples" and the like are intended to mean the specific features, structures, materials or characteristics described in connection with the embodiments or examples are comprised in at least one embodiment or example of the present disclosure. In the present specification, the schematic representation of the above terms is not necessarily directed to the same embodiment or example. Furthermore, the specific features, structures, materials, or characteristics described may be combined in a suitable manner in any one or more embodiments or examples. In addition, various embodiments or examples described in the specification, as well as features of various embodiments or examples, may be combined without conflicting.

It should also be noted that in the description of the present disclosure, relational terms such as first and second and the like may only be used to distinguish one entity or operation from another entity or operation without necessarily requiring or implying any actual relationship or order between such entities or operations. Furthermore, the term "comprise" or "include" or any other variations thereof is intended to encompass a non-exclusive inclusion, such that a process, method, article, or device that comprises a plurality of elements comprises not only those elements but also other elements not specifically listed, or elements that are inherent to such a process, method, article, or device. Without more restrictions, an element that is defined by the phrase "comprising one . . . " does not exclude the presence of additional equivalent elements in the process, method, article, or device that comprises the element.

Any process or method description in the flowcharts or otherwise described herein can be understood to represent a module, segment or portion of code comprising one or more executable instructions for implementing the steps of a custom logic function or process. And the scope of the optional embodiments of the present disclosure comprises additional implementations in which the functions may be performed in an order not shown or discussed, e.g., in a substantially simultaneous manner or in the reverse order, depending on the function involved, which will be understood by those skilled in the art.

The logic and/or steps represented in the flowchart or otherwise described herein, for example, may be considered as an ordered list of executable instructions for implementing logical functions, and may be embodied in any computer readable medium to be used by, or in conjunction with, an instruction execution system, apparatus, or device (e.g., a computer-based system, a system comprising a processor, or other system that can fetch and execute instructions from, an instruction execution system, apparatus, or device). In this specification, a "computer-readable medium" can be any apparatus that can contain, store, communicate, propagate, or transport a program for use in an instruction execution system, apparatus, or device, or in conjunction with such an instruction execution system, apparatus, or device. More specific examples of the computer readable medium may comprise, for example, the following: an electrical connection (electronic device) having one or more wires, a portable computer disk (magnetic device), a random access memory, read only memory, erasable programmable read only memory or flash memory, optical fiber devices, and compact disc read only memory. In addition, the computer readable medium may even be a paper or other suitable medium on which the program can be printed, as the paper or other medium may be optically scanned, followed by editing, interpretation or, if appropriate, other suitable manner to obtain the program electronically and then store it in computer memory.

The terms "component," "module," "device," and the like, when used in this specification, may generally mean a computer-related entity, hardware, or a combination of hardware and software, software, or software executed, unless the context clearly states otherwise. For example, such components can be, but are not limited to, processes running on a processor, a processor, an object, an executable file, an execution thread, a program, and/or a computer. For example, both an application running on a controller and a controller can be a component. One or more components can reside within a process and/or execution thread, and the components can be located on a single computer (device) and/or distributed between two or more computers (devices).

It should be understood that various parts of the present disclosure can be implemented in hardware, software, firmware, or a combination thereof. In the above-described embodiments, multiple steps or methods may be implemented in software or firmware stored in a memory and executed by a suitable instruction execution system. For example, if implemented in hardware, it can be implemented by any one or combination of the following techniques well known in the art: discrete logic circuits with logic gates for implementing logic functions on data signals, ASIC with appropriate combinational logic gates, programmable gate array, field programmable gate array, and the like.

One of ordinary skill in the art will appreciate that all or part of the steps of the above-described embodiments may be performed by hardware associated with program instructions, which may be stored in a computer readable storage medium, comprising, when executed, one or a combination of the steps of the method embodiments.

In addition, each functional unit in various embodiments of the present disclosure may be integrated into one processing module, or each unit may exist physically separately, or two or more units may be integrated into one module. The above integrated modules can be implemented in the form of hardware or in the form of software functional modules. The integrated modules, if implemented in the form of software functional modules and sold or used as separate products, may also be stored in a computer readable storage medium.

The invention claimed is:

1. A bezel member comprising:
a bezel mechanism comprising a fixed part and a retractable part connected to the fixed part;
a detecting mechanism configured to perform neighboring object presence detection for an end portion of the retractable part and generate a detection signal based on a detection result of the neighboring object presence detection; and a control mechanism configured to control extension and retraction of the retractable part according to the detection signal, wherein the detecting mechanism comprises a first detector at a side of the end portion of the retractable part of the bezel mechanism and configured to perform operations comprising:

performing the neighboring object presence detection for the side of the end portion, and generating a first signal in response to detecting presence of a neighboring object for the side of the end portion, and generating a second signal in response to the neighboring object for the side of the end portion being not detected, the second signal indicating that a length of the bezel mechanism exceeds an edge of the neighboring object for the side of the end portion, wherein the control mechanism is further configured to control the retractable part to extend in response to the first signal, and control the retractable part to stop extending in response to the second signal.

2. The bezel member according to claim 1, wherein the control mechanism further comprises a second detector at an end face of the end portion of the retractable part of the bezel mechanism configured to perform the neighboring object presence detection for the end face of the end portion and generate a third signal in response to detecting the presence of an neighboring object for the end face of the end portion, and wherein the control mechanism is further configured to control the retractable part to stop extending in response to at least one of the second signal or the third signal.

3. The bezel member according to claim 2, wherein the second detector is further configured to detect whether there is the first detector in an extending direction of the retractable part, and in response to the presence of the first detector in the extending direction, to detect a distance between the first detector and the second detector, and wherein the control mechanism is further configured to control the extension and the retraction of the retractable part according to the distance.

4. The bezel member according to claim 2, wherein at least one of the first detector or the second detector comprises at least one of a distance detector and a presence detector.

5. The bezel member according to claim 4, wherein the distance detector comprises an optical distance sensor, an infrared distance sensor, an ultrasonic distance sensor, and wherein the presence detector comprises an infrared or other heat based presence detectors, and ultrasound or other sound based presence detectors.

6. The bezel member according to claim 1, wherein the first detector is at a first distance from an end face on the side of the end portion of the retractable part, the first distance being equal to a width of the bezel mechanism.

7. The bezel member according to claim 1, wherein the bezel mechanism comprises a drive mechanism configured to drive the extension and the retraction of the retractable part, and wherein the control mechanism is further configured to control the drive mechanism according to the detection signal, to control the extension and the retraction of the retractable part.

8. The bezel member according to claim 1, wherein the retractable part is sleeved outside or inside the fixed part, and wherein the fixed part and the retractable part are connected to each other by a sliding mechanism.

9. The bezel member according to claim 8, wherein the sliding mechanism comprises a slide rail and a pulley movable along the slide rail, and wherein the slide rail is fixed to the fixed part and the pulley is fixed to the retractable part.

10. The bezel member according to claim 8, wherein the sliding mechanism comprises at least one of a ball bearing slider and a slider equipped with a roller.

11. The bezel member according to claim 8, wherein the retractable part comprises a plurality of retractable subportions that are connected by nesting.

12. The bezel member according to claim 1, wherein the control mechanism is further configured to receive a control signal and control the extension and the retraction of the retractable part according to the control signal.

13. A bezel device comprising a plurality of bezel units configured to cooperate with each other, wherein each of the bezel units comprises one or more bezel members, each of the one or more bezel members comprising:

a bezel mechanism comprising a fixed part and a retractable part connected to the fixed part;

a detecting mechanism configured to perform neighboring object presence detection for an end portion of the retractable part and generate a detection signal based on a detection result of the neighboring object presence detection; and a control mechanism configured to control extension and retraction of the retractable part according to the detection signal.

14. The bezel device according to claim 13, wherein at least one of the plurality of bezel units comprises two bezel members, and wherein the two bezel members are rotatably connected relative to each other at end portions of respective fixed parts such that a variable angle is formed between the two bezel members.

15. A method for controlling a bezel member, the bezel member comprising: a bezel mechanism with a fixed part and a retractable part connected to the fixed part, a detecting mechanism, and a control mechanism, the method comprising:

performing neighboring object presence detection for an end portion of the retractable part of the bezel mechanism and generating a detection signal based on a detection result of the neighboring object presence detection by using the detecting mechanism; and controlling extension and retraction of the retractable part according to the detection signal by using the control mechanism, wherein the performing neighboring object presence detection for the end portion of the retractable part of the bezel mechanism and generating a detection signal based on a detection result of the neighboring object presence detection by using the detecting mechanism, comprises:

performing neighboring object presence detection for a side of the end portion, and, in response to detecting the presence of a neighboring object for the side of the end portion, generating a first signal, otherwise generating a second signal indicating that a length of the bezel mechanism exceeds an edge of the neighboring object for the side of the end portion; and wherein the controlling the extension and the retraction of the retractable part according to the detection signal comprises in response to the first signal, controlling the retractable part to extend, and, in response to the second signal, controlling the retractable part to stop extending.

16. The method according to claim 15, wherein the performing neighboring object presence detection for the end portion of the retractable part of the bezel mechanism and generating a detection signal based on a detection result of the neighboring object presence detection by using the detecting mechanism, further comprises:

performing neighboring object presence detection for an end face of the end portion, and, in response to detecting the presence of a neighboring object for the end face of the end portion, generating a third signal, wherein the controlling the extension and the retraction of the retractable part according to the detection signal comprises in response to at least one of the second signal and the third signal, controlling the retractable part to stop extending.

\* \* \* \* \*